United States Patent
Kameyama

(10) Patent No.: US 9,121,099 B2
(45) Date of Patent: Sep. 1, 2015

(54) VACUUM PROCESSING APPARATUS AND PROCESSING METHOD USING THE SAME

(75) Inventor: Kazuhiro Kameyama, Kawasaki (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 547 days.

(21) Appl. No.: 13/325,108

(22) Filed: Dec. 14, 2011

(65) Prior Publication Data
US 2012/0160164 A1  Jun. 28, 2012

(30) Foreign Application Priority Data
Dec. 22, 2010  (JP) .................. 2010-286275

(51) Int. Cl.
C23C 16/52 (2006.01)
C23C 14/56 (2006.01)
C23C 14/54 (2006.01)

(52) U.S. Cl.
CPC .............. *C23C 14/568* (2013.01); *C23C 14/54* (2013.01)

(58) Field of Classification Search
None
See application file for complete search history.

(56) References Cited

U.S. PATENT DOCUMENTS

| 7,922,882 B2 | 4/2011 | Yoshida |
| 2009/0218214 A1* | 9/2009 | Sauer et al. .............. 204/192.12 |
| 2012/0009348 A1 | 1/2012 | Xia et al. |

FOREIGN PATENT DOCUMENTS

| JP | 06-510565 A | 11/1994 |
| JP | 2000-80472 A | 3/2000 |
| JP | 2003-065727 A | 3/2003 |
| WO | 92/17621 A1 | 10/1992 |
| WO | 2006/054663 A1 | 5/2006 |

OTHER PUBLICATIONS

Office Action issued on May 27, 2014, by the Japan Patent Office in corresponding Japanese Patent Application No. 2010-286275 (2 pages).

* cited by examiner

*Primary Examiner* — Charles Capozzi
(74) *Attorney, Agent, or Firm* — Buchanan Ingersoll & Rooney PC

(57) ABSTRACT

A vacuum processing apparatus includes a process chamber; a transport unit for transporting a plurality of substrates; a gas supply unit; a substrate processing unit for processing the substrates placed on the transport unit; a detection unit for detecting a substrate interval between adjacent substrates out of the plurality of substrates; and a control unit for controlling, based on the substrate interval detected by the detection unit, a supply amount of the gas to be supplied by the gas supply unit.

4 Claims, 4 Drawing Sheets

F I G. 2
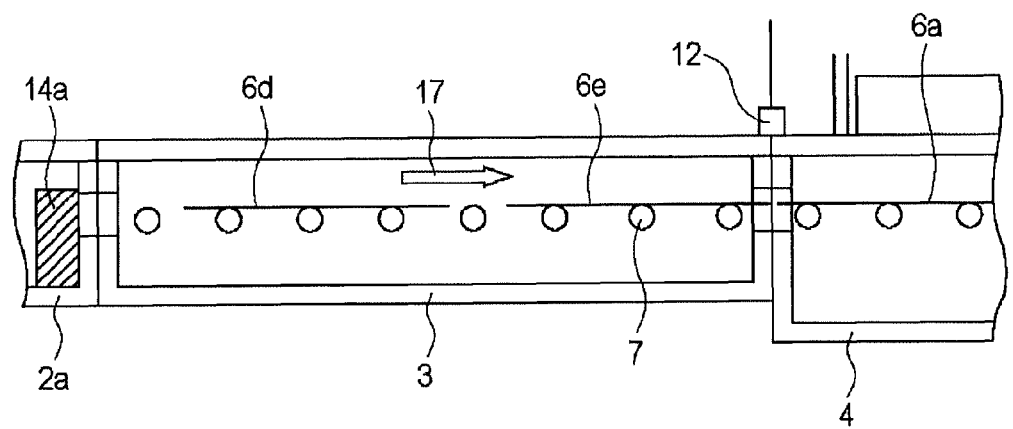

VACUUM PROCESSING APPARATUS AND PROCESSING METHOD USING THE SAME

BACKGROUND OF THE INVENTION

1. Field of the Invention

The present invention relates to a vacuum processing apparatus and a substrate processing method using the vacuum processing apparatus and, more particularly, to a transit-type vacuum processing apparatus that forms a thin film on a substrate during the passage of a plurality of substrates along the traveling direction through a chamber capable of reducing the pressure and a substrate processing method using the same.

2. Description of the Related Art

Conventionally, for example, a transport mechanism as disclosed in Japanese Patent Laid-Open No. 2000-80472 has been proposed to transport a large substrate of glass or the like in the horizontal state (to be referred to as horizontal transport hereinafter) in a vacuum processing apparatus that performs a deposition process for a liquid crystal panel.

Japanese Patent Laid-Open No. 2000-80472 also discloses an inline sputtering apparatus that performs deposition while horizontally transporting a large substrate of glass or the like. This inline sputtering apparatus features providing, between the target and the substrate transport plane, a plate member configured to prevent oblique incidence of sputtering particles from the target along the substrate transport direction.

In the conventional inline vacuum processing apparatus, the distance (to be also referred to as a substrate interval hereinafter) between substrates (between a preceding substrate and a succeeding substrate) that are continuous and adjacent to each other upon deposition affects the conductance and also affects the gas pressure in the process chamber. For this reason, it is necessary to form a complex transport mechanism capable of uniforming the distance between adjacent substrates and control the transport mechanism at exact transport timings.

SUMMARY OF THE INVENTION

The present invention provides a vacuum processing technique capable of controlling the supply amount of a gas to be supplied into a substrate interval process chamber based on the detection result of the interval between substrates arranged in the process chamber so as to obtain a gas pressure suitable for processing the substrates.

According to one aspect of the present invention, there is provided a vacuum processing apparatus comprising: a process chamber capable of reducing a pressure; transport means, provided in the process chamber, for transporting a plurality of substrates; gas supply means for supplying a gas to process the substrates in the process chamber; substrate processing means for processing the substrates placed on the transport means; detection means for detecting a substrate interval between adjacent substrates out of the plurality of substrates; and control means for controlling, based on the substrate interval detected by the detection means, a supply amount of the gas to be supplied by the gas supply means.

According to the present invention, it is possible to control the supply amount of a gas to be supplied into a substrate interval process chamber based on the detection result of the interval between substrates arranged in the process chamber so as to obtain a gas pressure suitable for processing the substrates.

When performing a process, for example, deposition for a plurality of substrates in a transit-type vacuum processing apparatus, the influence of the substrate interval on the atmosphere in a process chamber such as a deposition chamber can be suppressed. Even if the substrate interval varies, the gas supply amount can be controlled based on the substrate interval detection result. This allows to accept the variation in the substrate interval. For this reason, it is unnecessary to form a complex transport mechanism and control the transport mechanism at exact transport timings, unlike the related art.

Further features of the present invention will become apparent from the following description of exemplary embodiments (with reference to the attached drawings).

BRIEF DESCRIPTION OF THE DRAWINGS

FIG. 2 is a schematic view of a catch-up chamber in the vacuum processing apparatus according to the present invention;

DESCRIPTION OF THE EMBODIMENTS

An embodiment of the present invention will now be described by exemplifying a vacuum processing apparatus used to manufacture, for example, a solar cell.

Figure 1:
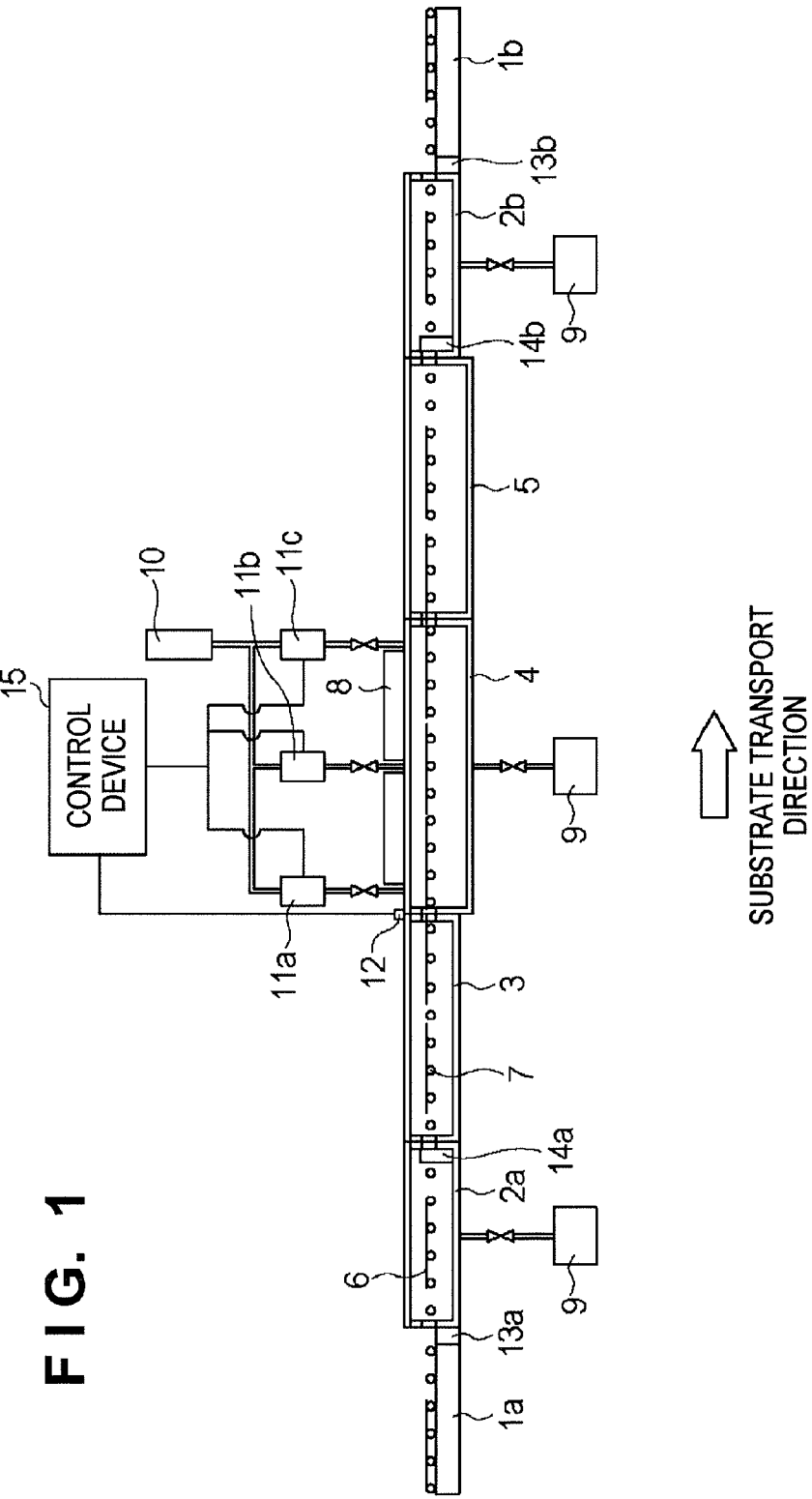
FIG. 1 is a schematic view showing the overall arrangement of a vacuum processing apparatus according to the present invention.

FIG. 1 is a schematic view of the vacuum processing apparatus according to an embodiment of the present invention. The vacuum processing apparatus includes a load lock chamber 2a, a catch-up chamber 3, a process chamber 4, a delivery chamber 5, and a load lock chamber 2b which are arranged in line along the substrate transport direction. Atmospheric stages 1a and 1b are connected to the load lock chambers 2a and 2b at the two ends, respectively. Vacuum pumps 9 are connected to the load lock chambers 2a and 2b and the process chamber 4, respectively. The vacuum pumps 9 evacuate the load lock chambers 2a and 2b and the process chamber 4 to a predetermined pressure or less in advance.

After opening the load lock chamber 2a to an atmospheric environment, a lock valve 13a is opened to move a substrate 6 from the atmospheric stage 1a to the load lock chamber 2a. The lock valve 13a is then closed, and the vacuum pump 9 evacuates the load lock chamber 2a to a predetermined pressure. After the load lock chamber 2a is evacuated to the predetermined pressure or less, a gate valve 14a is opened to move the substrate 6 to the catch-up chamber 3. The transport means in the catch-up chamber 3 increases the transport speed of the succeeding substrate 6 in the catch-up chamber 3 to shorten the distance to the preceding substrate 6 in the process chamber 4. The transport speed of the substrate 6 in the catch-up chamber 3 is higher than that of the substrate 6 in the process chamber 4. After the distance to the preceding substrate 6 is shortened in the catch-up chamber 3, the transport means in the catch-up chamber 3 moves the succeeding substrate 6 in the catch-up chamber 3 to the process chamber 4.

The process chamber 4 is much larger than the substrate 6. The transport means in the process chamber 4 moves the succeeding substrate 6 transported from the catch-up chamber 3 and at least one preceding substrate 6 ahead of the succeeding substrate 6 through the process chamber 4 at a uniform velocity as the substrates 6 arranged at an interval. The substrate processing unit in the process chamber 4 performs deposition on each substrate 6 moving at a uniform velocity through the process chamber 4 by, for example, sputtering using a target 8 or the like.

Each substrate 6 processed in the process chamber 4 is transported to the delivery chamber 5. After that, the transport means in the delivery chamber 5 transports the preceding substrate 6 at a transport speed higher than that of the transport means in the process chamber 4, thereby increasing the distance from the succeeding substrate 6 for delivery. The transport means in the delivery chamber 5 transports the preceding substrate 6 to the load lock chamber 2b. The load lock chamber 2b is then opened to the atmosphere to carry out the substrate to the atmospheric stage 1b.

In this embodiment, for example, transport rollers 7 using a servo motor can be adopted as the transport means in the load lock chamber 2a, the catch-up chamber 3, the process chamber 4, the delivery chamber 5, and the load lock chamber 2b, as shown in FIG. 1. The rotation speed of the transport rollers 7 is controlled by controlling the servo motor, thereby switching the substrate transport speed between acceleration, deceleration, and steady transport.

FIG. 2 is a schematic view of the catch-up chamber 3 according to this embodiment. To shorten the substrate interval between a succeeding substrate 6d and the preceding substrate 6a, the transport means 7 transports the substrate 6d up to a substrate position 6e at a transport speed higher than that of the substrate 6a in the process chamber 4. A direction 17 indicates the transport direction of the accelerated substrate 6d. After transporting the succeeding substrate 6d up to the substrate position 6e, the transport means 7 transports the preceding substrate 6a and the succeeding substrate 6d at a uniform velocity while keeping the distance between them constant.

Figure 3:
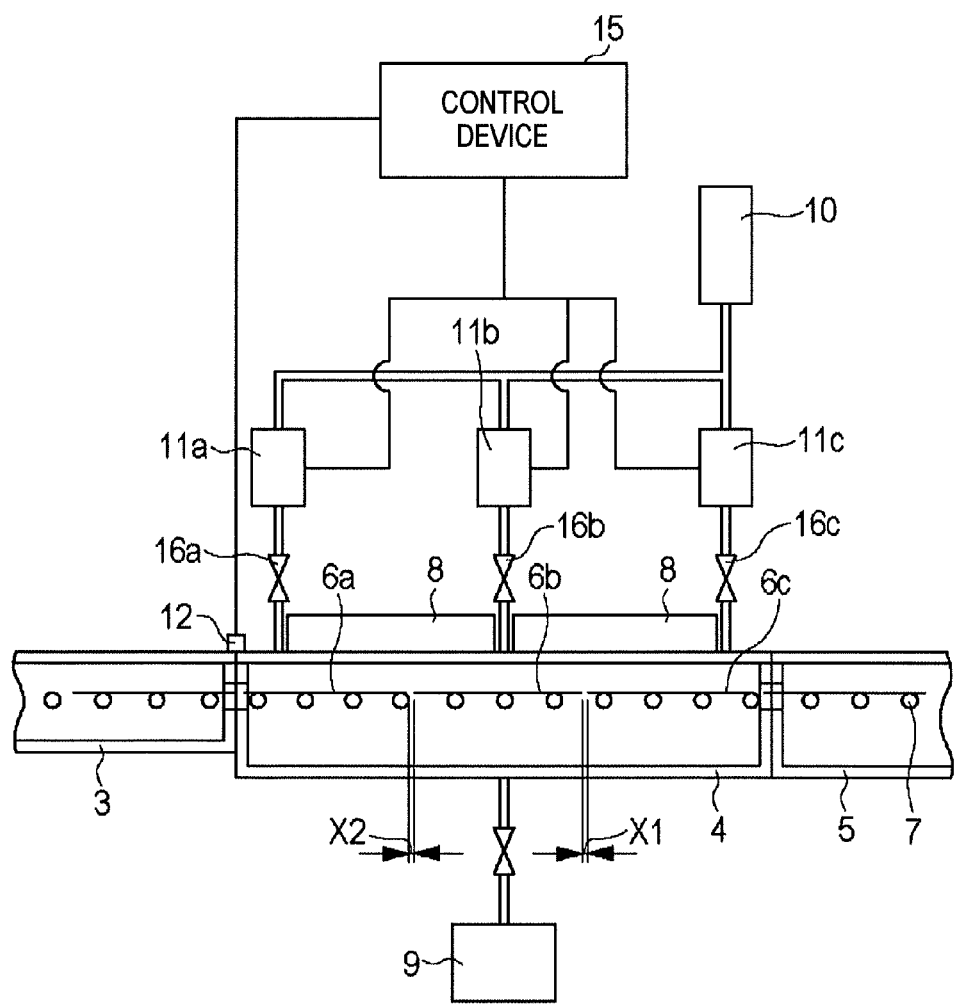
FIG. 3 is a schematic view of a process chamber in the vacuum processing apparatus according to the present invention.

FIG. 3 is a schematic view of the process chamber 4 according to this embodiment. The substrate interval after the catch-up operation in the catch-up chamber 3 is detected using a substrate detection sensor 12. The substrate detection sensor 12 serving as a detection means is assumed to be a laser sensor here. However, a sensor of any type capable of detecting a substrate is usable.

A control device 15 reads data detected by the substrate detection sensor 12. The control device 15 not only detects the presence/absence of a substrate but also measures the time after the substrate detection sensor 12 is turned off upon passage of the preceding substrate until it is turned on upon detecting the succeeding substrate. The measured time is multiplied by the substrate transport speed, thereby calculating the substrate interval between the preceding substrate 6a and the succeeding substrate 6d (X1 and X2 in FIG. 3 indicate the substrate interval).

Since the process chamber 4 is much larger than the substrate 6, each of the plurality of substrates arranged in the process chamber 4 has substrate intervals on the front and rear sides. The control device 15 repetitively calculates the substrate interval. This makes it possible to calculate the substrate interval between adjacent substrates for all substrates.

The substrates 6 are transported at a uniform velocity in the process chamber 4. Hence, the control device 15 can calculate the position of the substrate by measuring the time after the substrate detection sensor 12 has detected (passed) the substrate 6. The control device 15 can calculate the substrate position and the substrate interval and can therefore obtain the number of spaces between the substrates and the position of each substrate in the process chamber.

Based on the obtained number of the spaces between the substrates and the substrate interval, the flow rate of the process gas to be supplied into the process chamber 4 is controlled using mass flow controllers 11a, 11b, and 11c that are the constituent elements of the gas supply means. This enables to adjust the atmosphere in the process chamber 4. The flow rate of the process gas in the process chamber 4 can be controlled in accordance with the variation in the substrate interval by controlling the operation of the gas supply means including the plurality of mass flow controllers 11a, 11b, and 11c connected to a process gas cylinder 10, and valves 16a, 16b, and 16c.

Figure 4:
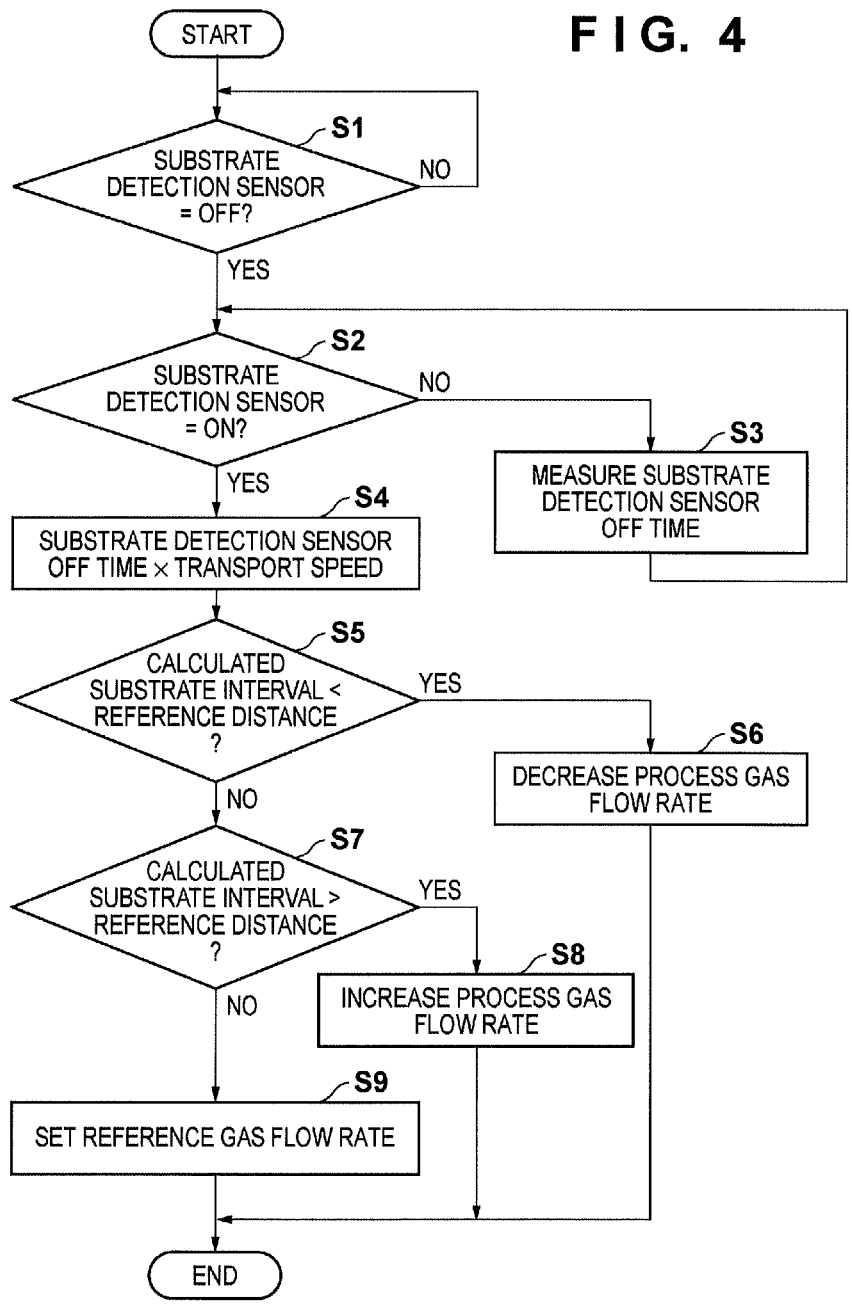
FIG. 4 is a flowchart for explaining flow control of a process gas in the process chamber according to an embodiment of the present invention.

The procedure of process gas flow rate control corresponding to the substrate interval in the process chamber 4 according to the embodiment and the substrate processing method will be described with reference to the flowchart of FIG. 4.

The vacuum processing apparatus according to the embodiment of the present invention detects the substrate position and the substrate interval using a substrate detection sensor or the like as the detection means, and calculates the distances between the substrates. As a characteristic feature, the vacuum processing apparatus adjusts the flow rate of the process gas in accordance with the calculated substrate interval and position, thereby performing feedback control to optimize the gas pressure in the process chamber.

Step S1 is a step of obtaining the state of the preceding substrate. After confirming that the preceding substrate 6a has passed through the substrate detection sensor 12, and the substrate detection sensor 12 has changed from the on state to the off state, the process advances to the next step.

Step S2 is a step of causing the substrate detection sensor 12 to conform the state of the succeeding substrate 6d. It is confirmed that the substrate detection sensor 12 has changed from the off state to the on state. Upon determining in step S2 that the substrate detection sensor 12 is not on, the process advances to step S3.

In step S3, to calculate the substrate interval between the preceding substrate 6a and the succeeding substrate 6d, the control device 15 measures the off time of the substrate detection sensor 12.

In step S4, the substrate interval between the preceding substrate 6a and the succeeding substrate 6d is calculated. The off time of the substrate detection sensor 12 measured in step S3 is multiplied by a preset predetermined substrate transport speed in the process chamber 4. Based on the time (off time) during which the substrate detection sensor 12 has detected no substrate, the control device 15 calculates the interval (substrate interval) between the preceding substrate 6a and the succeeding substrate 6d (to be also referred to as a "calculated substrate interval" hereinafter).

Step S5 is a step of determining the substrate interval from the preceding substrate. The control device 15 determines whether the substrate interval (calculated substrate interval) calculated in step S4 is larger than a substrate interval (to be also referred to as a "reference distance" hereinafter) set as a reference. If it is determined in step S5 that calculated substrate interval is lower than the reference distance (YES in step S5), the process advances to step S6. On the other hand, if it is determined in step S5 that calculated substrate interval is greater or equal than the reference distance (NO in step S5), the process advances to step S7.

Step S6 is a step of decreasing the flow rate of the process gas. The control device 15 controls the mass flow controllers 11a, 11b, and 11c as the control target to make the process gas flow rate lower than a predetermined gas flow rate (reference gas flow rate) serving as a reference, thereby decreasing the flow rate of the process gas.

Step S7 is a step of confirming that the calculated substrate interval is larger than the reference distance (calculated substrate interval>reference distance). The control device 15 compares the calculated substrate interval calculated in step S4 with the reference distance serving as the reference. If the calculated substrate interval is greater than the reference distance as the result of comparison (YES in step S7), the process advances to step S8. If NO in step S7 (calculated substrate interval=reference distance), the process advances to step S9.

Step S8 is a step of making the process gas flow rate higher than the reference gas flow rate. The control device 15 controls the mass flow controllers 11a, 11b, and 11c as the target to make the process gas flow rate higher than the reference gas flow rate.

In step S9, the control device 15 sets the current process gas flow rate as the reference gas flow rate (predetermined flow rate). Substrate processing in the process chamber 4 is done while maintaining the reference gas flow rate as the process gas flow rate.

The arrangements, shapes, sizes, and layout relationships described in the above embodiment are merely rough outlines for helping understanding and practicing the present invention. Hence, the present invention is not limited to the above-described embodiment, and various changes and modifications can be made without departing from the technical scope determined in the appended claims.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-286275, filed Dec. 22, 2010, which is hereby incorporated by reference herein in its entirety.

What is claimed is:

1. A vacuum processing apparatus comprising:
a process chamber connecting to a vacuum pump;
a transporter, which is provided in the process chamber, to transport a plurality of substrates;
a gas supply unit, which is provided on the same side as respective surfaces to be processed of the substrates, the gas supply unit having at least one flow control valve to supply process gas to process the substrates in the process chamber;
a target holder configured to support a target opposing the substrates, wherein the gas supply unit supplies the process gas to the substrates from a side of the target facing toward the surfaces of the substrates, and
a detection sensor configured to detect a substrate interval between adjacent substrates out of the plurality of substrates; and
a control device having a controller configured to control, based on the substrate interval detected by the detection sensor, the at least flow control valve and a supply amount of the process gas to be supplied by the gas supply unit.

2. The apparatus according to claim 1, wherein the controller is configured to compare the substrate interval with a predetermined reference distance and to control, based on a result of the comparison, the supply amount of the process gas to be supplied by the gas supply unit.

3. The apparatus according to claim 1, wherein the controller is configured to:
(i) when the substrate interval is shorter than a reference distance control said gas supply unit to make the supply amount of the process gas less than a gas flow rate serving as a reference,
(ii) when the substrate interval is longer than the reference distance, control the gas supply unit to make the supply amount of the process gas more than the gas flow rate serving as the reference, and
(iii) when the substrate interval equals the reference distance, control the gas supply unit to maintain the gas flow rate serving as the reference.

4. A substrate processing method using a vacuum processing apparatus:
wherein the vacuum processing apparatus comprises;
a process chamber connecting to a vacuum pump;
a transporter, which is provided in the process chamber, to transport a plurality of substrates;
a gas supply unit, which is provided on the same side as respective surfaces to be processed of the substrates, the gas supply unit having at least one flow control valve to supply process gas to process the substrates in the process chamber;
a target holder configured to support a target opposing the substrates, wherein the gas supply unit supplies the process gas to the substrates from a side of the target facing toward the surfaces of the substrates, and
a detection sensor configured to detect a substrate interval between adjacent substrates out of the plurality of substrates; and
a control device having a controller configured to control, based on the substrate interval detected by the detection sensor, the at least one flow control valve and supply amount of the process gas to be supplied by the gas supply unit;
wherein the method comprises:
detecting the substrate interval between the adjacent substrates out of the plurality of substrates; and
controlling the gas supply unit based on the substrate interval detected in the detecting of the substrate interval.

* * * * *